United States Patent
Okabe et al.

(10) Patent No.: US 7,269,529 B2
(45) Date of Patent: Sep. 11, 2007

(54) DATA PROCESSING APPARATUS, PROGRAM, AND METHOD FOR TESTING A SECURED CIRCUIT AND MAINTAINING CONFIDENTIALITY OF THE CIRCUIT

(75) Inventors: Masanobu Okabe, Kanagawa (JP); Masafumi Kusakawa, Tokyo (JP); Kyoji Shibutani, Kanagawa (JP); Sumio Morioka, Kanagawa (JP); Asami Yoshida, Kanagawa (JP); Muneki Shimada, Tokyo (JP); Shiho Moriai, Kanagawa (JP)

(73) Assignees: Sony Corporation, Tokyo (JP); Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 11/289,710

(22) Filed: Nov. 30, 2005

(65) Prior Publication Data
US 2006/0122802 A1    Jun. 8, 2006

(30) Foreign Application Priority Data
Dec. 2, 2004    (JP)    ............................ 2004-350378

(51) Int. Cl.
*G06F 21/00*    (2006.01)

(52) U.S. Cl. ...................... 702/117; 702/123; 713/194; 714/30; 714/733

(58) Field of Classification Search ................ 702/117, 702/119, 123
See application file for complete search history.

(56) References Cited

U.S. PATENT DOCUMENTS

| | | | |
|---|---|---|---|
| 2002/0133773 A1* | 9/2002 | Richter et al. | ............. 714/733 |
| 2003/0145261 A1* | 7/2003 | Tanizaki | .................... 714/718 |
| 2004/0034823 A1* | 2/2004 | Watkins et al. | ............. 714/724 |
| 2004/0236961 A1* | 11/2004 | Walmsley | ................... 713/200 |
| 2005/0289355 A1* | 12/2005 | Kitariev et al. | ............. 713/182 |

* cited by examiner

*Primary Examiner*—Hal Wachsman
(74) *Attorney, Agent, or Firm*—Rader, Fishman & Grauer PLLC

(57) ABSTRACT

A data processing apparatus that tests whether a secure circuit is normal or not while maintaining confidentiality of the secured circuit is provided: wherein the secured circuit conducts a self-diagnostic test thereof in accordance with a self-diagnostic test start instruction signal from a CPU, and the secured circuit outputs a self-diagnostic test result signal indicating whether the secured circuit is normal or not to the CPU.

6 Claims, 6 Drawing Sheets

DATA PROCESSING APPARATUS, PROGRAM, AND METHOD FOR TESTING A SECURED CIRCUIT AND MAINTAINING CONFIDENTIALITY OF THE CIRCUIT

CROSS REFERENCES TO RELATED APPLICATIONS

The present invention contains subject matter related to Japanese Patent Application No. 2004-350378 filed in the Japan Patent Office on Dec. 2, 2005, the entire contents of which being incorporated herein by reference.

BACKGROUND OF THE INVENTION

1. Field of the Invention

The present invention relates to a data processing apparatus incorporating a processor and a secured circuit therein, the secured circuit, a program and a data processing method, and particularly relates to a data processing apparatus including a characteristic test of the secured circuit, a program, a secured circuit and a data processing method.

2. Description of the Related Art

In an LSI (large scale integrated) circuit, a variety of tests, such as a scan test as an overall test of the circuit, a memory test exclusively for a memory, and a function test for testing the circuit performance and speed, are used to check whether the LSI circuit operates as required or not.

In an LSI circuit of the related art, a CPU in the LSI circuit controls and monitors an operation of a processing circuit in the LSI circuit via an internal bus in a function test as above.

An LSI circuit sometimes incorporates a secured circuit, wherein content and data to be processed includes confidentiality, for example, as in encrypting/decrypting processing and authentication processing, etc.

However, in the LSI circuit of the related art, although a built-in secured circuit itself is secure, the internal bus is not secured, so that there is a possibility that an operation of the secured circuit may be illicitly monitored by monitoring the internal bus at an test operation of the LSI circuit.

SUMMARY OF THE INVENTION

The present invention was made to eliminate the disadvantage of the related art as explained above by providing a data processing apparatus capable of testing whether a secured circuit is normal or not while maintaining confidentiality of the secured circuit, the secured circuit, a program and a data processing method.

According to the first invention, there is provided a data processing apparatus incorporating a processor and a tamper-resistant secured circuit, wherein the processor outputs a test start instruction to the secured circuit; and the secured circuit is provided with a test means for conducting a self-diagnostic test on the secured circuit and, when the test start instruction is received from the processor, the test means conducts a self-diagnostic test of the secured circuit and outputs a test result indicating whether the secured circuit is normal or not to the processor.

An operation of the data processing apparatus of the first invention is as below.

The processor outputs an instruction to start a test to the secured circuit.

When the secured circuit receives the test start instruction from the processor, the test means conducts a self-diagnostic test and outputs the test result indicating whether the secured circuit is normal or not to the processor.

According to the second invention, there is provided a secured circuit having tamper-resistance, comprising an interface for receiving as an input a test start instruction and outputting a test result indicating whether the secured circuit is normal or not; and a test means for conducting a self-diagnostic test of the secured circuit when receiving the test start instruction via the interface and outputting a test result indicating whether the secured circuit is normal or not via the interface.

An operation of the secured circuit of the second invention is as below.

The interface receives a test start instruction.

Then, in accordance with the test start instruction, the test means conducts the self-diagnostic test on the secured circuit and outputs the test result indicating whether the secured circuit is normal or not through the interface.

According to the third invention, there is provided a program to be executed by a tamper-resistant secured circuit, comprising a first routine for inputting a test start instruction; a second routine for conducting a self-diagnostic test on the secure circuit in accordance with the test start instruction input in the first routine; and a third routine for outputting a test result indicating whether the secured circuit is normal or not based on the self-diagnostic test performed in the second routine.

According to the fourth invention, there is provided a data processing method for testing whether the secured circuit is normal or not by using a processor and a tamper-resistant secured circuit, including a first step that the processor outputs a test start instruction to the secured circuit; and a second step for conducting a self-diagnostic test of the secured circuit in accordance with the test start instruction input in the first step and outputting a test result indicating whether the secured circuit is normal or not to the processor.

According to the present invention, a data processing apparatus capable of testing whether a secured circuit is normal or not while maintaining confidentiality of the secured circuit, the secured circuit, a program and a data processing method can be provided.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Figure 1:
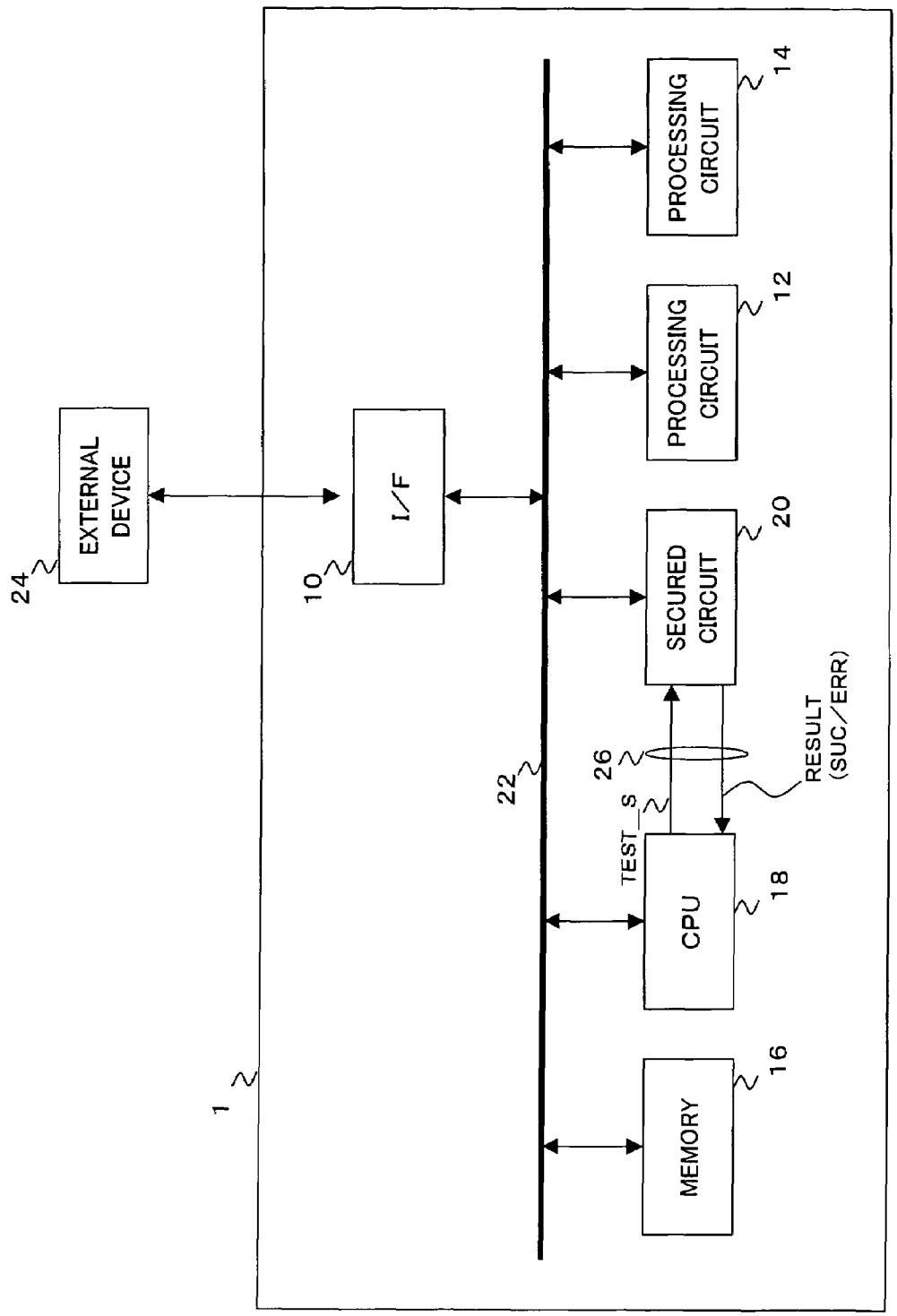
FIG. 1 is a view of the overall configuration of a data processing apparatus according to an embodiment of the present invention.

FIG. 1 is a view of the overall configuration of a data processing apparatus 1 according to an embodiment of the present invention.

As shown in FIG. 1, the data processing apparatus 1 includes, for example, an external interface 10, a processing circuit 12, a processing circuit 14, a memory 16, a CPU 18 and a secured circuit 20 connected by an internal bus 22.

Note that the data processing apparatus 1 is realized, for example, as a semiconductor chip.

The CPU 18 and the secured circuit 20 are connected via an exclusive signal line 26.

Note that the configuration shown in FIG. 1 is an example, so the number of the processing circuits 12 and 14 may be any or they may be omitted.

The external interface 10 exchanges data with an external device 24 provided outside of the data processing apparatus 1.

The external interface 10 is connected to the internal bus 22.

The processing circuits 12 and 14 are for performing processing other than secure processing of the data processing apparatus 1.

The memory 16 stores a program regulating processing of the CPU 18 and a variety of data to be used by the processing.

The CPU 18 executes a program read from the memory 16 to integrally control processing of the data processing apparatus 1.

For example, the CPU 18 outputs a self-diagnostic test start instruction signal TEST_S to the secured circuit 20 via the exclusive signal line 26 when in a self-diagnostic test mode.

Also, in the self-diagnostic test mode, the CPU receives as an input a self-diagnostic test result signal RESULT from the secured circuit 20 via the exclusive signal line 26.

The self-diagnostic test result signal RESULT is, for example, either one of a normal result signal SUC indicating that a function of the secured circuit 20 is normal and an abnormal result signal ERR indicating that something is wrong with a function of the secured circuit 20.

As explained above, in the self-diagnostic test mode, only the self-diagnostic test start instruction signal TEST_S and the self-diagnostic test result signal RESULT are sent/received between the CPU 18 and the secured circuit 20, and confidentiality of the secured circuit 20 can be maintained even if these signals are monitored.

The secured circuit 20 performs processing on content and data including confidentiality, such as decoding processing and authentication processing.

The secured circuit 20 is a tamper-resistant hardware circuit and provided with a confidentiality maintenance function for preventing processing and data inside the secure circuit 20 from being monitored or tampered with from the outside.

The secured circuit 20 makes an access to the outside thereof in the self-diagnostic test operation but rejects any control (interference) from the outside during the access.

Furthermore, even when operations of components other than the secured circuit 20 in the data processing apparatus 1, data on the internal bus 22 and a signal on the exclusive signal line 26 are monitored, processing inside the secured circuit 20 and confidential data stored therein are protected from leaking to the outside.

Also, the data processing apparatus 1 prohibits any access to the secured circuit 20 insofar as the power of the data processing apparatus 1 is turned off after the self-diagnostic test operation of the secured circuit 20.

When a self-diagnostic test start instruction signal TEST_S is received from the CPU 18 via the exclusive signal line 26, the secured circuit 20 activates a self-diagnostic test program T_PRG for a self-diagnostic test operation to conduct a self-diagnostic test of the secured circuit 20. Namely, the secured circuit 20 is provided with a built In Self Test (BIST) and a self-diagnosis function.

After confirming that the function of the secured circuit 20 is normal as a result of the self-diagnostic test operation, the secured circuit 20 outputs a normal result signal SUC to the CPU 18 via the exclusive signal line 26.

On the other hand, when it is determined that something is wrong with the function of the secured circuit 20, the secured circuit 20 outputs an abnormal result signal ERR to the CPU 18 via the exclusive signal line 26.

In a normal operation mode, the secured circuit 20 reads a normal processing program N_PRG from the memory 34 and executes the same for performing a normal operation.

Figure 2:
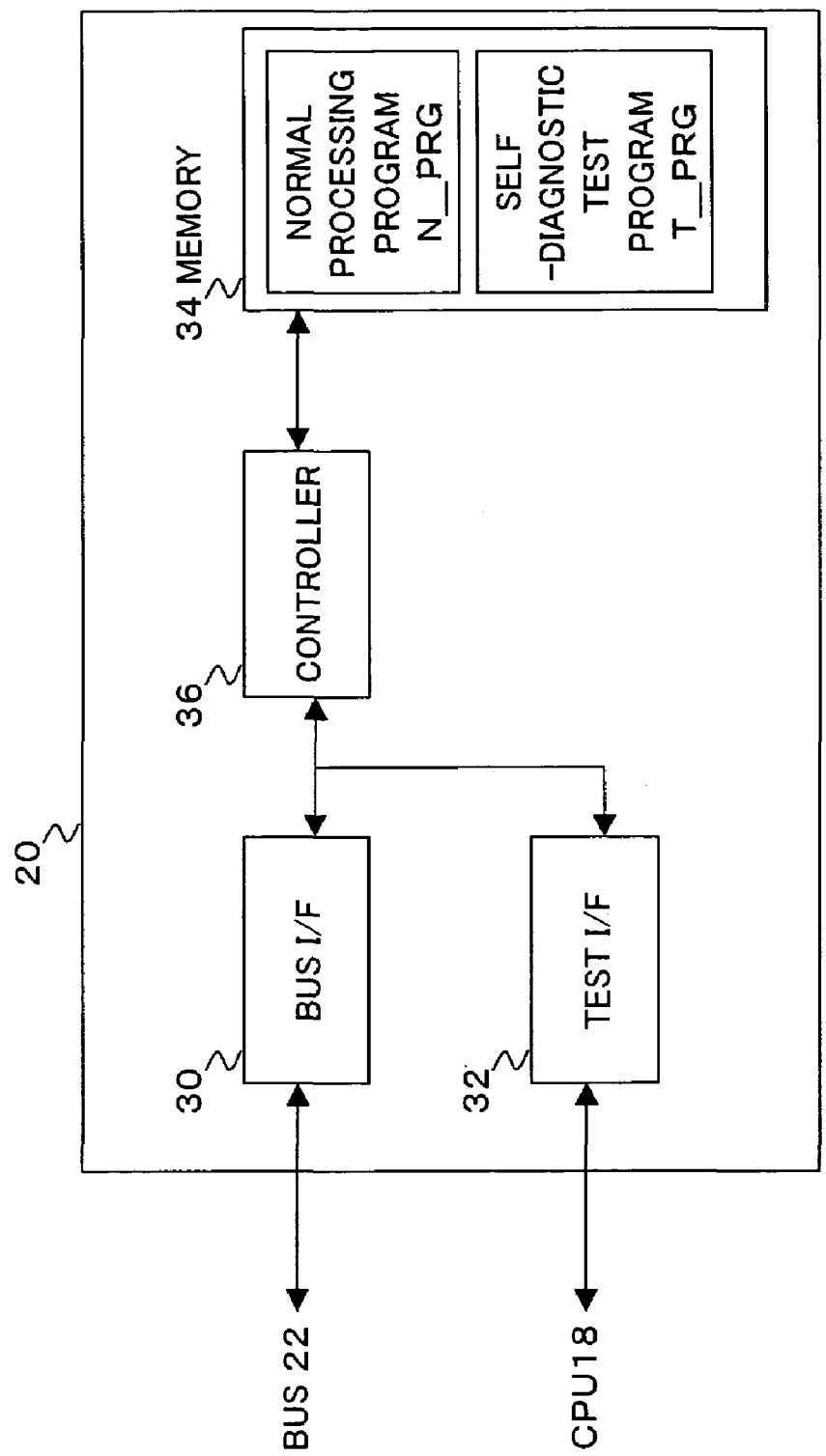
FIG. 2 is a view of the configuration of a secured circuit shown in FIG. 1.

FIG. 2 is a view of the configuration of the secured circuit shown in FIG. 1.

As shown in FIG. 2, the secured circuit 20 includes, for example, a bus interface 30, a test interface 32, a memory 34 and a controller 36.

The bus interface 30 exchanges data with outside of the secured circuit 20 via the internal bus 22.

The test interface 32 exchanges a signal with the CPU 18 at a self-diagnostic test operation.

Specifically, the test interface 32 makes the self-diagnostic test start instruction signal TEST_S output from the CPU 18.

Also, the test interface 32 outputs the self-diagnostic test result signal RESULT to the CPU 18.

The memory 34 stores the normal processing program N_PRG and the self-diagnostic test program T_PRG.

When a self-diagnostic test instruction signal TEST_S is not input from the CPU 18 via the test interface 32, the controller 36 executes the normal processing program N_PRG read from the memory 34 for performing a normal operation.

Figure 3:
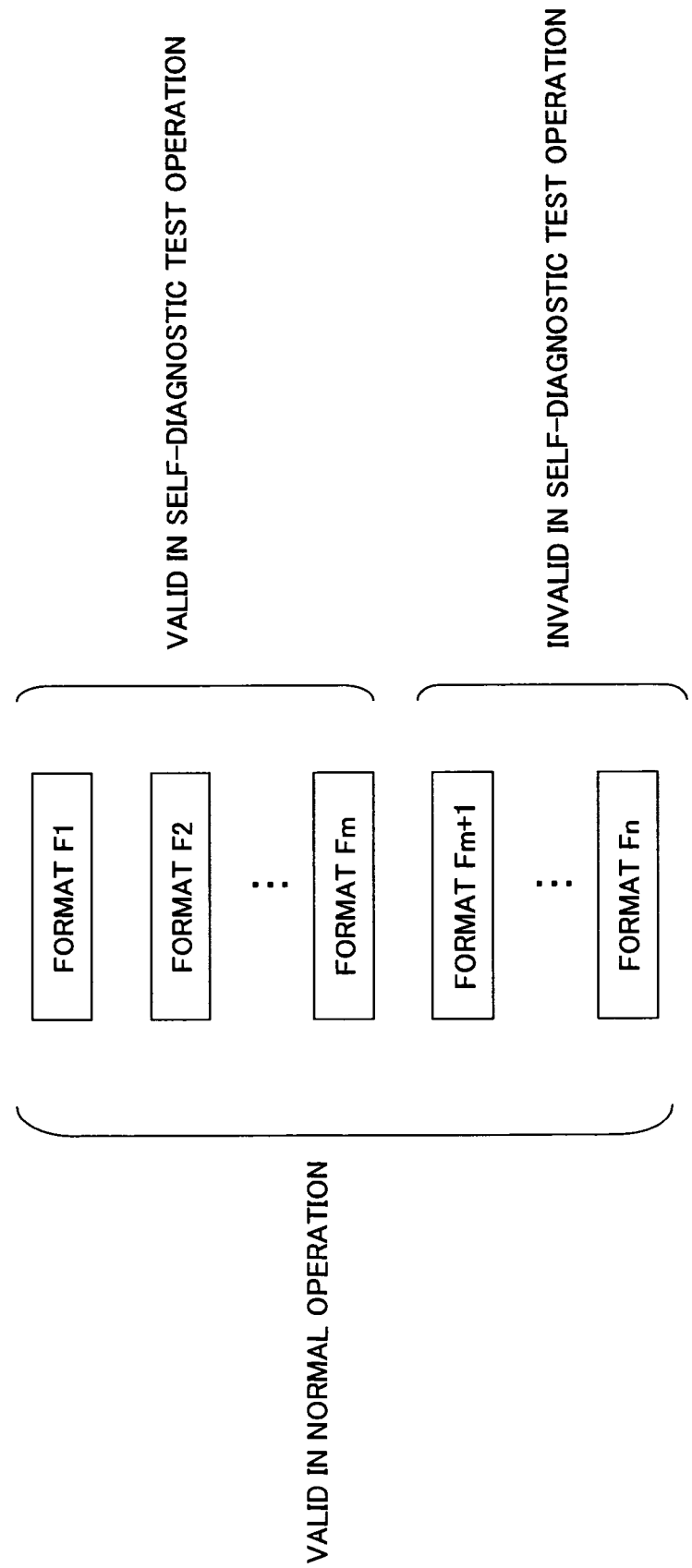
FIG. 3 is a view for explaining a data format to be input to the secured circuit in a self-diagnostic test operation and a normal operation of the secured circuit shown in FIG. 1.

The controller 36 determines whether data input via the bus interface 30 satisfies any one of the formats F1 to Fn shown in FIG. 3 and, on condition that it is determined to be satisfying, uses the input data in the normal operation.

Furthermore, when a self-diagnostic test start instruction signal TEST_S is received from the CPU 18 via the test interface 32, the controller 36 executes a self-diagnostic test program T_PRG read from the memory 34 to perform a self-diagnostic test operation.

In the self-diagnostic test operation, the controller 36 determines whether data input via the bus interface 30 satisfies any one of the formats F1 to Fm (m<n) shown in FIG. 3 and, on condition that it is determined satisfying, uses the input data for the self-diagnostic test operation.

Figure 4:
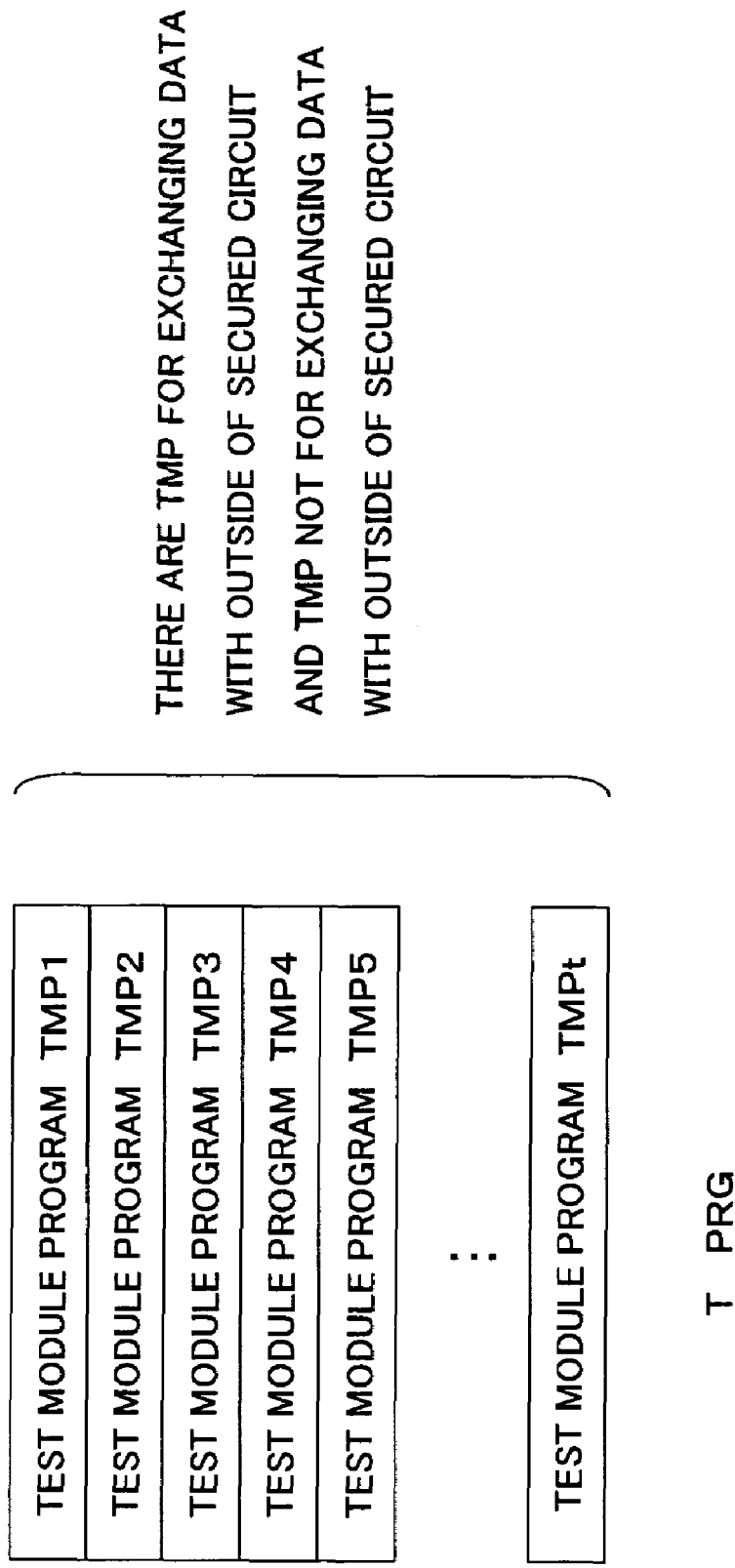
FIG. 4 is a view for explaining a self-diagnostic test module program composing a self-diagnostic test program T_PRG shown in FIG. 2.

FIG. 4 is a view for explaining a self-diagnostic test module program composing the self-diagnostic test program T_PRG.

As shown in FIG. 4, the self-diagnostic test program T_PRG is composed of a plurality of self-diagnostic test module programs TMP1 to TMPt.

The self-diagnostic test program T_PRG executes the self-diagnostic test module programs TMP1 to TMPt in this order or in a predetermined order.

In the self-diagnostic test module programs TMP1 to TMPt, for example, a part thereof describes self-diagnostic test processing of exchanging data with the outside of the secured circuit 20 and the rest describes self-diagnostic test processing of not exchanging data with the outside of the secured circuit 20.

The controller 36 permits data exchange with the internal bus 22 via the bus interface 30 while the self-diagnostic test module programs TMP1 to TMPt describing the self-diagnostic test processing of exchanging data with the outside of the secured circuit 20 are executed in the step of executing the self-diagnostic test program T_PRG.

Here, the self-diagnostic test processing for exchanging data with the outside of the secured circuit 20 is, for example, processing for verifying whether key data to be used in encrypting/decrypting processing or authentication processing stored in the memory 34 is a desired key data or not by using verification key data input from the outside of the secured circuit 20.

On the other hand, the controller 36 prohibits data exchange with the internal bus 22 via the bus interface 30 while the self-diagnostic test module programs TMP1 to TMPt describing the self-diagnostic test processing of not exchanging data with the outside of the secured circuit 20 are executed.

Also, the self-diagnostic test processing of not exchanging data with the outside of the secured circuit 20 is, for example, processing for determining whether a processing time of the normal processing program N_PRG by the controller 36 satisfies a predetermined standard or not.

Below, a test operation of the data processing apparatus 1 shown in FIG. 1 will be explained.

Note that, in the operation example below, mainly a self-diagnostic test of the secured circuit 20 will be explained, but tests of the processing circuits 12 and 14 and the memory 16 are also performed by the CPU 18 besides the self-diagnostic test of the secured circuit 20 in the data processing apparatus 1.

Also, in the present embodiment, a test indicates at least one of a function test for testing performance and speed of the circuit, a scan test and a memory test. Which test should be performed is suitably determined in accordance with the chip configuration of the data processing apparatus 1 and a characteristic of information to be protected.

Figure 5:
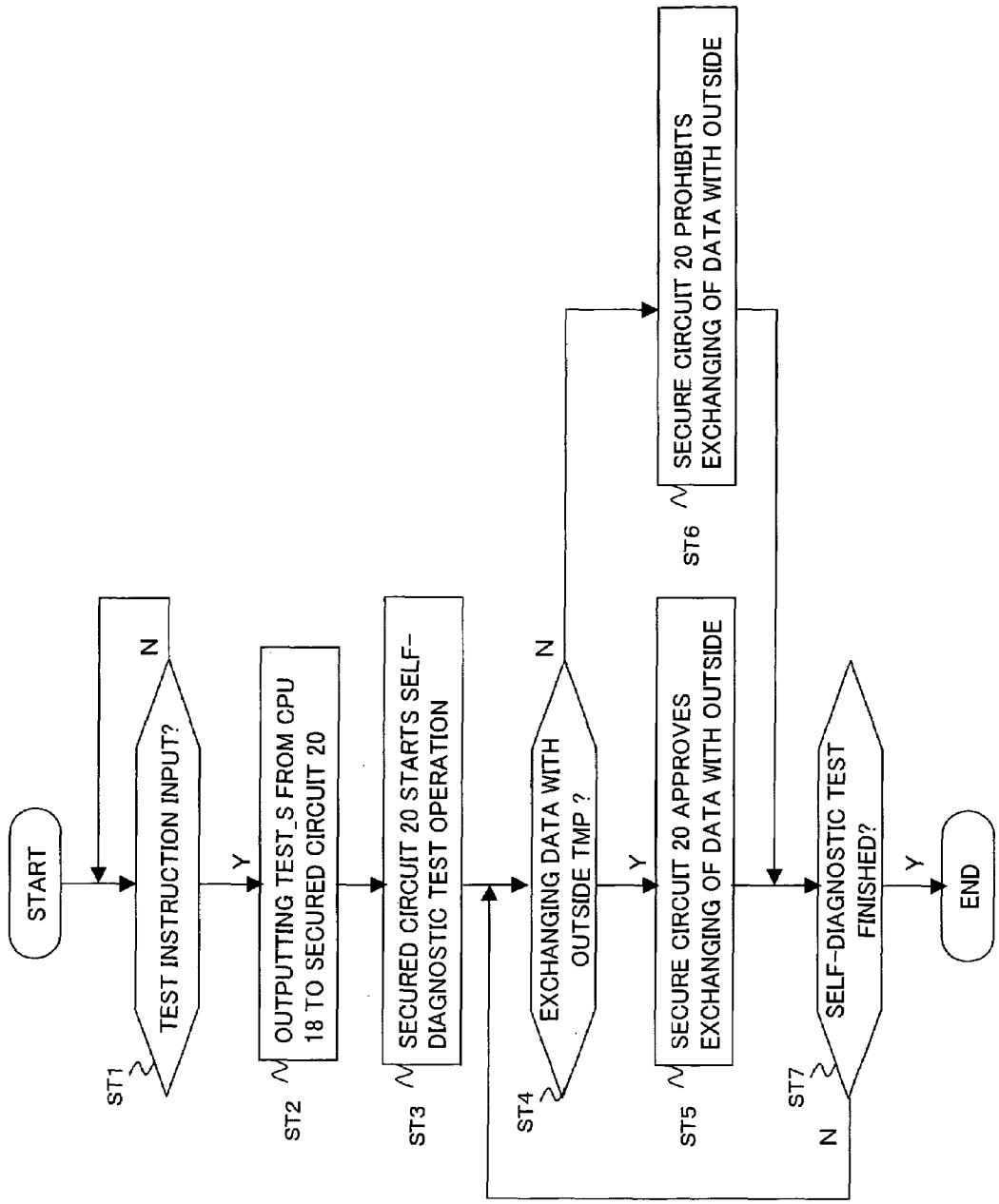
FIG. 5 is a flowchart for explaining a test operation of the data processing apparatus shown in FIG. 1.

FIG. 5 is a flowchart for explaining a test operation of the data processing apparatus 1 shown in FIG. 1.

Step ST1:
On condition that the CPU 18 of the data processing apparatus 1 shown in FIG. 1 received a test start instruction from the external device 24 via the external interface 10, the procedure proceeds to a step ST2.

Step ST2:
The CPU 18 of the data processing apparatus 1 outputs a self-diagnostic test start instruction signal TEST_S to the secured circuit 20 via the exclusive signal line 26 based on the test start instruction input in the step ST1.

The secured circuit 20 outputs a self-diagnostic test start instruction signal TEST_S input via the test interface 32 shown in FIG. 2 to the controller 36.

Step ST3:
The controller 36 of the secured circuit 20 reads the self-diagnostic program T_PRG from the memory 34 and executes the same on condition that the self-diagnostic test start instruction signal TEST_S is input in the step ST2.

As a result, the secured circuit 20 shifts to a test mode and a self-diagnostic test starts.

The secured circuit 20 executes the plurality of self-diagnostic test module programs TMP1 to TMPt composing the self-diagnostic test program T_PRG shown in FIG. 4 in order in the self-diagnostic test.

Step ST4:
The controller 36 of the secured circuit 20 determines whether a self-diagnostic test module program to be executed next among those TMP1 to TMPt is to exchange data with the outside of the secured circuit 20 or not and, when determined that it exchanges data with the outside, proceeds to a step ST5, while not, proceeds to a step ST6.

Step ST5:
The controller 36 of the secured circuit 20 performs self-diagnostic test operation by following the next test module program among those TMP1 to TMPt and approves data exchange via the bus interface 30 shown in FIG. 2 at the self-diagnostic test operation.

Note that the secured circuit 20 determines whether or not data input via the test interface 32 during the self-diagnostic test operation matches with any one of the formats F1 to Fm shown in FIG. 3 and, on condition that it is determined to be matched, uses the input data for the self-diagnostic test operation.

Step ST6:
The controller 36 of the secured circuit 20 performs a self-diagnostic test operation by following next test module program among those TMP1 to TMPt and prohibits data exchange via the bus interface 30 shown in FIG. 2 during the self-diagnostic test operation.

Step ST7:
The controller 36 of the secured circuit 20 determines whether all of the self-diagnostic test module programs TMP1 to TMPt composing the self-diagnostic test program T_PRG finished the processing or not and, when determined finished, finishes the self-diagnostic test operation and outputs a self-diagnostic test result signal RESULT indicating the self-diagnostic test result to the CPU 18 via the test interface 32.

Specifically, the controller 36 outputs a normal result signal SUC as the self-diagnostic test result signal RESULT to the CPU 18 via the test interface 32 when all self-diagnostic test results corresponding to the respective self-diagnostic test module programs TMP1 to TMPt indicate that the secured circuit 20 is normal.

On the other hand, the controller 36 outputs an abnormal result signal ERR as the self-diagnostic test result signal RESULT to the CPU 18 via the test interface 32, for example, when at least one of the self-diagnostic test results corresponding to the respective self-diagnostic test module programs TMP1 to TMPt indicates that the secured circuit 20 is abnormal.

As explained above, according to the data processing apparatus 1, only a self-diagnostic test start instruction signal TEST_S and a self-diagnostic test result signal RESULT are exchanged between the CPU 18 and the secured circuit 20 via the exclusive signal line 26 in the self-diagnostic test operation of the secured circuit 20, so that even if these signals are monitored from the outside of the data processing apparatus 1, an operation and data of the secured circuit 20 cannot be perceived. Therefore, it is possible to prevent confidentiality of the secured circuit 20 from being lost by the test of the secured circuit 20.

Also, according to the data processing apparatus 1, in the self-diagnostic test operation of the secured circuit 20, as explained above with reference to FIG. 3, a part of the formats F1 to Fm are considered valid and the rest of the formats Fm+1 to Fn are considered invalid among the formats F1 to Fn to be validated at the normal operation as a format of data input from the outside of the secured circuit 20. As a result, in the self-diagnostic test operation of the secured circuit 20, possibilities that illicit data is processed by the secured circuit 20 from the outside of the secured circuit 20 can be effectively reduced.

Also, according to the data processing apparatus 1, as explained above with reference to FIG. 4, in the step of executing the self-diagnostic test program T_PRG, the secured circuit 20 prohibits data exchange with the internal bus 22 via the bus interface 30 during executing a self-diagnostic test module program among those TMP1 to TMPt describing self-diagnostic test processing of not exchanging data with the outside of the secured circuit 20. As a result, it is possible for the secured circuit 20 to reduce time for exchanging data with the outside during the self-diagnostic test operation, so that leakage of confidentiality of the secured circuit 20 can be effectively suppressed.

As explained above, according to the data processing apparatus 1, even when a test is conducted thereon, confidentiality of the secured circuit can be maintained, it is possible to ship the data processing apparatus 1 after checking that the secured circuit 20 operates normally, and both of the demands for maintaining confidentiality and maintaining the product quality can be satisfied.

The present invention is not limited to the above embodiments.

Figure 6:
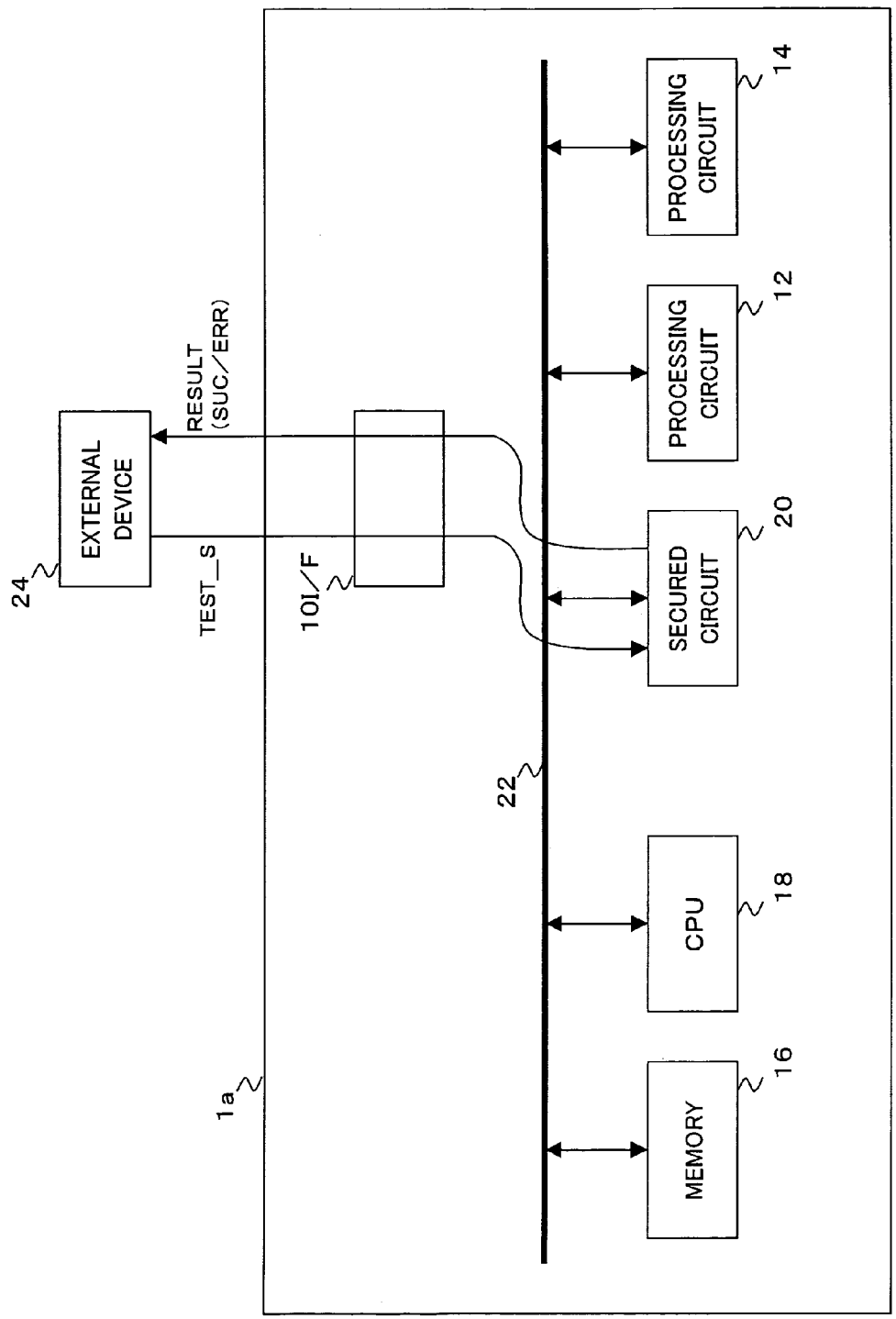
FIG. 6 is a view for explaining a modified example of a data processing apparatus of the present embodiment.

In the above embodiments, as shown in FIG. 1, the case of exchanging a self-diagnostic test start instruction signal TEST_S and self-diagnostic test result signal RESULT between the CPU 18 and the secured circuit 20 via the CPU 18 in the data processing apparatus 1 was explained as an example. However, for example, as shown in FIG. 6, the self-diagnostic test start instruction signal TEST_S and self-diagnostic test result signal RESULT may be exchanged with the external device 24 outside of the data processing apparatus 1a via the external interface 10 (external pin).

The present invention can be applied to a system using a secured circuit, wherein a self-diagnostic test is performed.

It should be understood by those skilled in the art that various modifications, combinations, sub-combinations and alternations may occur depending on design requirements and other factors insofar as they are within the scope of the appended claims or the equivalents thereof.

What is claimed is:

1. A data processing apparatus incorporating a processor and a tamper-resistant secured circuit, wherein:
   said processor outputs a test start instruction to said tamper-resistant secured circuit;
   said tamper-resistant secured circuit is provided with a test means for conducting a self-diagnostic test on the tamper-resistant secured circuit and, when said test start instruction is received from said processor, said test means conducts a self-diagnostic test of the tamper-resistant secured circuit and outputs a test result indicating whether the tamper-resistant secured circuit is normal or not to said processor;
   wherein when said tamper-resistant secured circuit performs a normal operation other than said self-diagnostic test, on condition that data input to said tamper-resistant secured circuit matches with any one of a predetermined plurality of formats regulated in advance, said test means brings said secured circuit to perform processing using the input data; while when performing said self-diagnostic test, on condition that the data input to said tamper-resistant secured circuit matches with a predetermined part of formats among said predetermined plurality of formats, said test means performs said self-diagnostic test by using the input data.

2. A data processing apparatus as set forth in claim 1, wherein:
   said self-diagnostic test comprises a plurality of test modules, and
   said test means approves data exchange with elements outside of said tamper-resistant secured circuit when executing one of said test modules that is among a predetermined part of said plurality of test modules, while said test means prohibits data exchange with elements outside of said secured circuit when executing one of said test modules that is not among said predetermined part of said plurality of test modules.

3. A secured circuit comprising:
   an interface for receiving as an input a test start instruction and outputting a test result indicating whether said secured circuit is normal or not; and
   a test means for conducting a self-diagnostic test of the secured circuit when receiving said test start instruction via said interface and outputting a test result indicating whether the secured circuit is normal or not via said interface,
   wherein when said secured circuit performs a normal operation other than said self-diagnostic test, on condition that data input to said secured circuit matches with any one of a predetermined plurality of formats regulated in advance, said test means brings said secured circuit to perform processing by using the input data; while in an operation of said self-diagnostic test, on condition that the data input to said secured circuit matches with a predetermined part of formats among said predetermined plurality of formats, the test means performs said self-diagnostic test by using the input data.

4. A secured circuit as set forth in claim 3, wherein
   said self-diagnostic test comprises a plurality of test modules, and
   said test means approves data exchange with elements outside of said secured circuit via said interface when executing one of said test modules that is among a predetermined part of said plurality of test modules, while said test means prohibits data exchange with elements outside of said secured circuit via said interface when executing one of said test modules that is not among said predetermined part of said plurality of test modules.

5. A computer program product stored on a computer-readable medium and configured for execution by a tamper-resistant secured circuit, comprising:
   a first routine for receiving a test start instruction as input;
   a second routine for conducting a self-diagnostic test on said tamper-resistant secured circuit in accordance with said test start instruction input in said first routine,
      wherein conducting said self-diagnostic test comprises executing a plurality of test modules, and
      wherein the computer program determines whether each executed test module is permitted to exchange data with elements outside the tamper-resistant secured circuit; and
   a third routine for outputting a test result indicating whether the tamper-resistant secured circuit is normal or not based on said self-diagnostic test performed in said second routine.

6. A data processing method for testing whether a tamper-resistant secured circuit is normal or not by using a processor and the tamper-resistant secured circuit, including:
- a first step that said processor transmits a test start instruction to said tamper-resistant secured circuit;
- and a second step for conducting a self-diagnostic test of the tamper-resistant secured circuit in accordance with said test start instruction transmitted in said first step, wherein conducting said self-diagnostic test comprises executing a plurality of test modules, and wherein the tamper-resistant secured circuit determines whether each executed test module is permitted to exchange data with elements outside the tamper-resistant secured circuit; and
- a third step for outputting a test result indicating whether the tamper-resistant secured circuit is normal or not to said processor.

* * * * *

UNITED STATES PATENT AND TRADEMARK OFFICE
CERTIFICATE OF CORRECTION

| | | |
|---|---|---|
| PATENT NO. | : 7,269,529 B2 | Page 1 of 1 |
| APPLICATION NO. | : 11/289710 | |
| DATED | : September 11, 2007 | |
| INVENTOR(S) | : Masanobu Okabe et al. | |

It is certified that error appears in the above-identified patent and that said Letters Patent is hereby corrected as shown below:

Column 7, Line 64:
"while" should read -- and --.

Signed and Sealed this

Eighteenth Day of December, 2007

JON W. DUDAS
*Director of the United States Patent and Trademark Office*